(12) United States Patent
Ueta

(10) Patent No.: US 6,590,919 B1
(45) Date of Patent: Jul. 8, 2003

(54) NITRIDE GROUP COMPOUND SEMICONDUCTOR LASER DEVICE AND METHOD FOR PRODUCING THE SAME

(75) Inventor: Yoshihiro Ueta, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/265,916

(22) Filed: Mar. 10, 1999

(30) Foreign Application Priority Data

Mar. 10, 1998 (JP) .......................................... 10-058603

(51) Int. Cl.⁷ .................................................. H01S 5/00
(52) U.S. Cl. ........................................... 372/46; 372/45
(58) Field of Search ..................................... 372/45, 46

(56) References Cited

U.S. PATENT DOCUMENTS

| | | | | |
|---|---|---|---|---|
| 4,984,243 A | * | 1/1991 | Kagawa et al. | 372/46 |
| 5,217,567 A | * | 6/1993 | Cote et al. | 216/67 |
| 5,379,312 A | * | 1/1995 | Bour et al. | 372/45 |
| 5,812,576 A | * | 9/1998 | Bour et al. | 372/45 |
| 5,974,069 A | * | 10/1999 | Tanaka et al. | 372/46 |
| 5,987,048 A | * | 11/1999 | Ishikawa et al. | 372/46 |
| 6,111,275 A | * | 8/2000 | Hata | 372/46 |

FOREIGN PATENT DOCUMENTS

| | | |
|---|---|---|
| JP | 08088441 A | 4/1996 |
| JP | 08097502 A | 4/1996 |

OTHER PUBLICATIONS

Mayer et al, Electronic Materials Science: For Integrated Circuits In SI And GAAS, New York: MacMillan Publishing Company, 1990 (no month), pp. 394–395.*

* cited by examiner

Primary Examiner—Quyen Leung
(74) Attorney, Agent, or Firm—Morrison & Foerster LLP

(57) ABSTRACT

A nitride group compound semiconductor laser device of the present invention includes: a pair of cladding layers; an active layer interposed between the cladding layers; and a current constriction layer having a stripe-shaped opening which is to be a current passage, provided above the active layer, wherein the current constriction layer is formed of a high resistant layer obtained by crystallizing an amorphous or polycrystalline nitride group compound semiconductor by heating.

14 Claims, 3 Drawing Sheets

NITRIDE GROUP COMPOUND SEMICONDUCTOR LASER DEVICE AND METHOD FOR PRODUCING THE SAME

BACKGROUND OF THE INVENTION

1. Field of the Invention

The present invention relates to a nitride group compound semiconductor laser device which emits laser light in a range of ultraviolet to blue, and a production method thereof.

2. Description of the Related Art

In recent years, as a material for a semiconductor laser device which emits laser light in the range of ultraviolet to blue, a nitride group compound semiconductor $Ga_xAl_yIn_{1-(x+y)}N$ ($0 \leq x \leq 1$, $0 \leq y \leq 1$, $0 \leq x+y \leq 1$) has been used.

With a nitride group compound semiconductor laser device, some structures and production methods thereof have been proposed. Among them, a structure having a current constriction layer capable of simultaneously conducting current constriction and light confinement is expected as a highly reliable structure capable of reducing a driving current and stabilizing an oscillation transverse mode.

As an example, a semiconductor laser device 300 disclosed in Japanese Laid-Open Publication No. 8-97502 is shown in FIG. 3.

The semiconductor laser device 300 includes a sapphire substrate 301, an n-type GaN buffer layer 302, an n-type $Al_{0.2}Ga_{0.8}N$ first cladding layer 303, an $In_{0.15}Ga_{0.85}N$ active layer 304, a p-type $Al_{0.2}Ga_{0.8}N$ second cladding layer 305, an n-type Si current constriction layer 306 having a stripe-shaped opening 320, a p-type $Al_{0.2}Ga_{0.8}N$ third cladding layer 307, and a p-type GaN contact layer 308. The first cladding layer 303, the active layer 304, the second cladding layer 305, the current constriction layer 306, the third cladding layer 307, and the contact layer 308 are partially removed so as to expose the buffer layer 302. A p-side electrode 309 is formed on the contact layer 308, and an n-side electrode 310 is formed on an exposed portion of the buffer layer 302.

In the above-mentioned conventional nitride group compound semiconductor laser device 300, the current constriction layer 306 made of a light-absorbing material is formed in the vicinity of the active layer 304, whereby stable optical waveguide can be realized. However, the current constriction layer 306 is made of Si, and has a forbidden bandgap sufficiently smaller than that of energy corresponding to light generated by the active layer 304, so that an absorption coefficient becomes large ($5 \times 10^5$ cm$^{-1}$) at the current constriction layer 306, which increases a loss in the waveguide. As a result, a semiconductor laser device which oscillates at an oscillating threshold current of about 100 mA or less, required for ensuring reliability, cannot be obtained.

Furthermore, in the conventional nitride group compound semiconductor laser device 300, when laser light is absorbed by the current constriction layer 306 and heat is generated locally in the vicinity of the stripe-shaped opening 320, the crystal is strained due to a large difference ($2 \times 10^{-6}$) in the thermal expansion coefficient between Si, which is a material for the current constriction layer 306, and a GaN type material. Thus, a semiconductor laser device may be damaged during operation.

In order to solve the above-mentioned problem, it is currently being studied whether GaInN having a large composition of In can be used for the current constriction layer 306. However, it is difficult to grow GaInN having a large composition of In with satisfactory controllability at an ordinary growth temperature. Furthermore, GaInN having a large composition of In has a large absorption coefficient ($1 \times 10^5$ cm$^{-1}$) with respect to a wavelength of laser light. Therefore, a waveguide loss increases, which results in an oscillating threshold current of more than about 100 mA in the same way as in the case using Si, making reliability of the device unsatisfactory.

As described above, in the conventional example, a highly reliable nitride group compound semiconductor laser device which oscillates at an oscillating threshold current of about 100 mA or less in a stable transverse mode cannot be realized.

The main cause for the above problem is as follows: An absorption coefficient in a wavelength region of blue to ultraviolet is large ($1 \times 10^5$ cm$^{-1}$) in the current constriction layer which also functions so as to form a waveguide by light absorption. Therefore, an absorption loss in the waveguide increases, which results in an oscillating threshold current of more than about 100 mA; thus, the device will be thermally damaged during oscillation.

Furthermore, in the case where a material such as Si whose thermal expansion coefficient is largely different from that of a GaN type material is used for the current constriction layer, the device is damaged by local absorption of laser light. Therefore, a highly reliable nitride group compound semiconductor laser device cannot be obtained.

SUMMARY OF THE INVENTION

A nitride group compound semiconductor laser device of the present invention includes: a pair of cladding layers; an active layer interposed between the cladding layers; and a current constriction layer having a stripe-shaped opening which is to be a current passage, provided above the active layer, wherein the current constriction layer is formed of a high resistant layer obtained by crystallizing an amorphous or polycrystalline nitride group compound semiconductor by heating.

In one embodiment of the present invention, the current constriction layer is made of $Ga_xAl_yIn_{1-(x+y)}N$ ($0 \leq x \leq 1$, $0 \leq y \leq 1$, $0 \leq x+y \leq 1$) containing impurities in an amount of $1 \times 10^{20}$ cm$^{-3}$ or more.

Alternatively, a nitride group compound semiconductor laser device of the present invention includes: a pair of cladding layers; an active layer interposed between the cladding layers; and a current constriction layer excluding a stripe-shaped portion which is to be a current passage, provided above the active layer, wherein the current constriction layer is formed of a high resistant layer obtained by irradiating charged particles to crystal of a nitride group compound semiconductor.

In one embodiment of the present invention, a re-evaporation preventing layer or an etching stop layer is provided between the active layer and the current constriction layer.

In another embodiment of the present invention, a re-evaporation preventing layer or an etching stop layer is provided between the active layer and the current constriction layer.

In another embodiment of the present invention, a contact layer is provided above both the current constriction layer and the stripe-shaped opening or the stripe-shaped portion.

According to another aspect of the present invention, a method for producing the above-mentioned nitride group compound semiconductor laser device includes the steps of: growing the first cladding layer and the active layer; growing the amorphous or polycrystalline nitride group compound semiconductor layer on the active layer; conducting wet etching with respect to the nitride group compound semiconductor layer at a temperature of 80° C. or lower to form the stripe-shaped opening; and growing the second cladding layer so as to bury the stripe-shaped opening.

In one embodiment of the present invention, the nitride group compound semiconductor layer is grown at a temperature of less than about 700° C.

In another embodiment of the present invention, the nitride group compound semiconductor layer is grown at a temperature in a range of about 400° C. to about 600° C.

Alternatively, a method for producing the above-mentioned nitride group compound semiconductor laser device includes the steps of: growing the first cladding layer, the active layer, and the second cladding layer; and irradiating charged particles to the second cladding layer except for the stripe-shaped portion to form the irradiated portion as the current constriction layer.

Hereinafter, the function of the present invention will be described.

According to the present invention, the current restriction layer provided above the active layer is formed of a high resistant layer which is obtained by crystallizing an amorphous or polycrystalline nitride group compound semiconductor by heating.

The amorphous or polycrystalline nitride group compound semiconductor can be grown with good controllability at a low temperature (less than about 700° C.), and the film thus obtained can be rendered highly resistant by including carbon (C) or silicon (Si) in a high concentration (e.g., about $1 \times 10^{20}$ cm$^{-3}$ or more). Thus, the current constriction layer effectively blocks a current.

Furthermore, the current constriction layer can be rendered highly resistant by including impurities to have a thickness of about several 10 nm. Therefore, the surface of the contact layer to be grown thereon can easily be made smooth. In the specification, high resistance refers to a resistivity of about $1 \times 10^3$ Ω·cm or more.

Furthermore, as described later in Embodiment 1, since an absorption coefficient involved in an impurity level can be utilized, an absorption coefficient with respect to a laser oscillating wavelength can be prescribed to be low (e.g., about $5 \times 10^3$ cm$^{-1}$) which is smaller than an absorption coefficient (about $5 \times 10^5$ cm$^{-1}$) utilizing an absorption between bandgaps of an ordinary semiconductor. Thus, light confinement in a transverse direction due to light absorption can be realized without increasing an unnecessary waveguide light absorption, and stable transverse mode characteristics can be obtained. Also, the oscillating threshold current can be reduced.

Furthermore, unlike single crystal having a very strong bond grown at a high temperature exceeding about 700° C., an amorphous or polycrystalline nitride group compound semiconductor grown at a low temperature (less than about 700° C.) can be easily subjected to wet etching at a temperature suitable for photolithography with an alkaline aqueous solution at about 80° C. or lower. The stripe-shaped opening is formed by this etching, and the second cladding layer is grown so as to bury the stripe-shaped opening, whereby a current passage can be formed.

Furthermore, in the amorphous or polycrystalline nitride group compound semiconductor, constituent atoms are re-arranged during a temperature increasing process (re-growth after etching), and the semiconductor is formed into single crystal under the condition that it contains impurities in a high concentration. Therefore, a crystal quality of a semiconductor layer to be grown thereon will not be degraded.

Furthermore, since a nitride group compound semiconductor $Ga_xAl_yIn_{1-(x+y)}N$ ($0 \leq x \leq 1$, $0 \leq y \leq 1$, $0 \leq x+y \leq 1$) can be used for the current constriction layer, a difference in a thermal expansion coefficient between the current constriction layer and the current passage portion can be decreased. Thus, unlike a conventional semiconductor laser device using Si, according to the present invention, the current constriction layer will not have its crystal strained even when absorbing laser light, thereby preventing a semiconductor laser device from being damaged during an operation.

In the case where $Ga_xAl_yIn_{1-(x+y)}N$ ($0 \leq x \leq 1$, $0 \leq y \leq 1$, $0 \leq x+y \leq 1$) is used for the current constriction layer, it is preferable that impurities are added in an amount of about $1 \times 10^{20}$ cm$^{-3}$ or more.

Furthermore, by providing a re-evaporation preventing layer between the active layer and the current constriction layer, the active layer can be prevented from evaporating. By providing an etching stop layer between the active layer and the current constriction layer, etching controllability can be enhanced. The etching stop layer and the re-evaporation preventing layer can be formed as one layer.

In another example of a nitride group compound semiconductor laser device of the present invention, the current constriction layer provided above the active layer is formed of a high resistant layer which is obtained by irradiating charged particles to crystal of a nitride group compound semiconductor.

For example, by irradiating charged particles to a part of the cladding layer disposed above the active layer, the stripe-shaped portion (non-irradiated portion) to be a current passage and the current constriction layer (irradiated portion) can be formed with good controllability. The portion irradiated with charged particles includes a high-density carrier stop to be rendered highly resistant, so that the irradiated portion can effectively block a current.

Furthermore, the current constriction layer can be rendered highly resistant by the irradiation of charged particles, and its surface becomes highly impervious to damage. Therefore, the surface of the contact layer to be grown thereon can easily be made smooth.

Furthermore, as described later in Embodiment 2, since a current constriction layer with an increased absorption coefficient, due to a defect level, can be obtained, and an absorption coefficient with respect to a laser oscillating wavelength can be prescribed to be low (e.g., about $5 \times 10^4$ cm$^{-1}$), which is smaller than an absorption coefficient (about $5 \times 10^5$ cm$^{-1}$), utilizing an absorption between bandgaps of an ordinary semiconductor. Thus, light confinement in a transverse direction due to light absorption can be realized without increasing an unnecessary waveguide light absorption, and stable transverse mode characteristics can be obtained. Also, an oscillating threshold current can be reduced.

Furthermore, since a nitride group compound semiconductor $Ga_xAl_yIn_{1-(x+y)}N$ ($0 \leq x \leq 1$, $0 \leq y \leq 1$, $0 \leq x+y \leq 1$) can be used for the current constriction layer, a difference in a thermal expansion coefficient between the current constriction layer and the current passage portion can be decreased. Thus, unlike a conventional semiconductor laser device using Si, according to the present invention, the current constriction layer will not have its crystal strained even when absorbing laser light, thereby preventing a semiconductor laser device from being damaged during an operation.

Furthermore, by providing a re-evaporation preventing layer between the active layer and the current constriction layer, the active layer can be prevented from evaporating.

Thus, the invention described herein makes possible the advantages of: (1) providing a highly reliable nitride group compound semiconductor laser device which oscillates at a low threshold current in a stable transverse mode; and (2) providing a method for producing such a device.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative embodiments with reference to the drawings.

Embodiment 1

Figure 1:
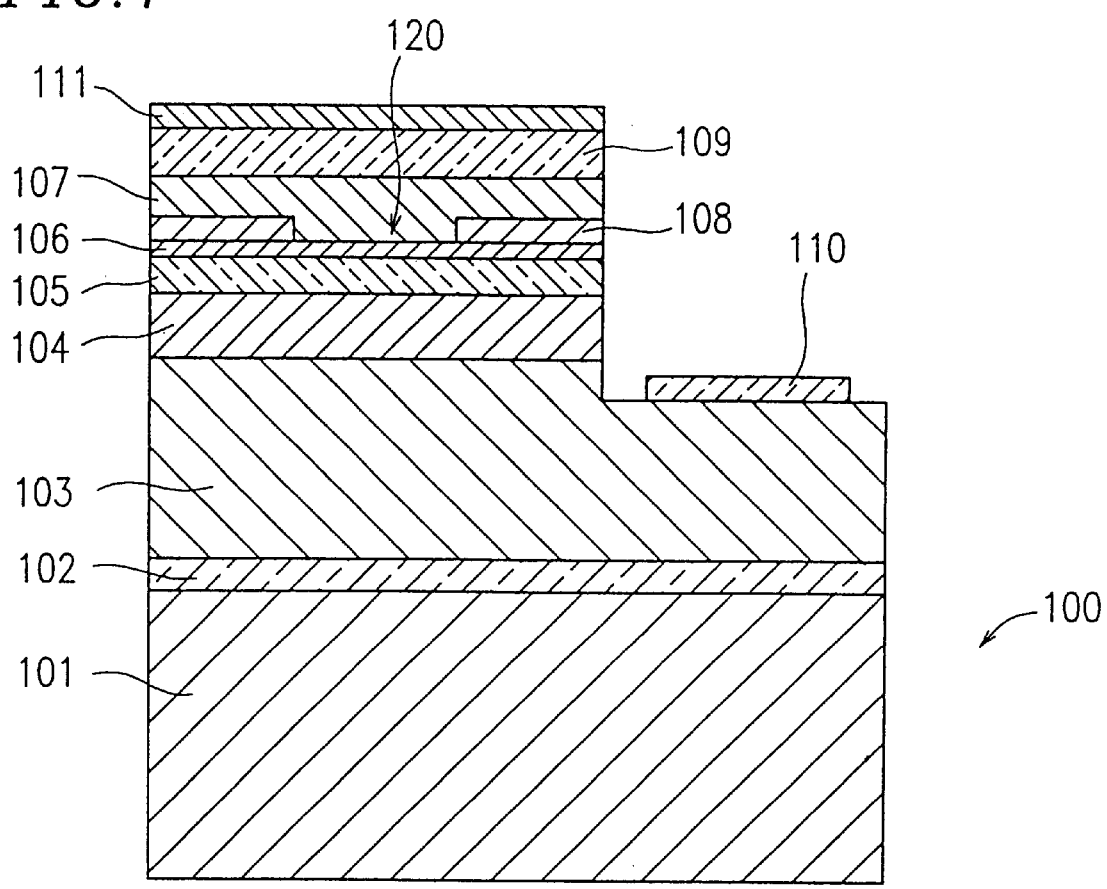
FIG. 1 is a cross-sectional view showing a structure of a nitride group compound semiconductor laser device in Embodiment 1 of the present invention.

FIG. 1 is a cross-sectional view showing a structure of a nitride group compound semiconductor laser device 100 in Embodiment 1 of the present invention.

The semiconductor laser device 100 includes a GaN buffer layer 102, an n-type GaN contact layer 103, an n-type $Al_{0.15}Ga_{0.85}N$ first cladding layer 104, an $In_{0.25}Ga_{0.75}N$ active layer 105, and a p-type GaN etching stop and re-evaporation preventing layer 106 on a C-plane of a sapphire substrate 101. A GaN current constriction layer 108 having a stripe-shaped opening 120 is formed on the p-type GaN etching stop and re-evaporation preventing layer 106, and the stripe-shaped opening 120 forms a current passage. A p-type $Al_{0.15}Ga_{0.85}N$ second cladding layer 107 is formed on the etching stop and re-evaporation preventing layer 106 so as to fill the stripe-shaped opening 120. On the second cladding layer 107, a contact layer 109 is formed. The first cladding layer 104, the active layer 105, the etching stop and re-evaporation preventing layer 106, the current constriction layer 108, the second cladding layer 107, and the contact layer 109 are partially removed so as to expose the contact layer 103. A p-side electrode 111 is formed on the contact layer 109, and an n-side electrode 110 is formed on an exposed portion of the contact layer 103.

The semiconductor laser device 100 is produced as described below.

First, the sapphire substrate (wafer) (C-plane) 101 is placed in a reactor furnace in a metal organic chemical vapor deposition (MOCVD) apparatus, and the inside of the reactor furnace is sufficiently replaced by hydrogen. Thereafter, the substrate temperature is raised to about 1500° C. in a flow of hydrogen and ammonia ($NH_3$). The substrate is allowed to stand for about 10 minutes. Thus, the surface of the substrate 101 is cleaned.

Next, the substrate temperature is lowered to about 500° C., and this temperature is maintained. Thereafter, trimethylgallium (TMG) (about $3\times10^{-5}$ mols per min.) and $NH_3$ (about 5 liters per min.) are flowed, and allowed to grow for about one minute, whereby the buffer layer 102 is grown to a thickness of about 30 nm.

Then, TMG (about $3\times10^{-5}$ mols per min.), $NH_3$ (about 5 liters per min.), and mono-silane ($SiH_4$) (0.3 cc per min.) are flowed, and allowed to grow for about 60 minutes. Thus, the contact layer 103 is grown to a thickness of about 0.4 µm. Thereafter, trimethylammonium (TMA) ($6\times10^{-6}$ mols per min.) and $SiH_4$ (0.3 cc per min.) are flowed in addition to TMG and $NH_3$, and allowed to grow for about 25 minutes. Thus, the first cladding layer 104 is grown to a thickness of about 0.2 µm. The electron concentration of the first cladding layer 104 is about $2\times10^{10}$ $cm^{-3}$.

Thereafter, the supply of TMG, TMA, and $SiH_4$ is stopped and the substrate temperature is lowered to about 700° C. While this substrate temperature is maintained, TMG ($4\times10^{-4}$ mols per min.) and trimethylindium (TMI) ($4\times10^{-4}$ mols per min.) are flowed, and allowed to grow for about 12 seconds. Thus, the active layer 105 is grown to a thickness of about 10 nm. The light-emitting peak wavelength of the active layer 105 is about 432 nm at room temperature.

Next, TMG (about $3\times10^{-5}$ mols per min.), bis(cyclopentadienyl)magnesium ($CP_2Mg$) ($5\times10^{-6}$ mols per min.), and $NH_3$ (5 liters per min.) are flowed while the substrate temperature is kept at about 700° C., and allowed to grow for about 12 seconds, whereby the etching stop and re-evaporation preventing layer 106 is grown to a thickness of about 60 nm. The etching stop and reevaporation preventing layer 106 functions so as to prevent the active layer 105 from evaporating as well as to stop etching when the stripe-shaped opening 120 is formed in the current constriction layer 108.

While maintaining the substrate temperature at about 500° C., TMG (about $3\times10^{-5}$ mols per min.) and $NH_3$ (about 5 liters per min.) are flowed and allowed to grow for about 2 minutes. Thus, the current constriction layer 108 is grown to a thickness of about 60 nm. The current constriction layer 108 is confirmed to be amorphous by X-ray analysis and RHEED. Furthermore, the carbon (C) concentration and the resistivity of the current constriction layer 108 are measured to be about $1\times10^{21}$ $cm^{-3}$ and about $7\times10^3$ $\Omega\cdot cm$, respectively, by an SIMS. Carbon contained in the current constriction layer 108 in a high concentration is considered to originate from undestroyed methyl groups of TMG. C, Si, and other impurities can be introduced into the current constriction layer 108 by simultaneously supplying an organic compound, a hydrogen compound, or the like containing impurity atoms together with a typically used III-group material, a V-group material, or the like in the same way as in doping in an MOCVD method. An amorphous GaN layer is separately grown to a thickness of about 2 µm at about 600° C., and measured for a light absorption coefficient at a laser oscillating wavelength of about $5\times10^3$ $cm^{-1}$. This light absorption coefficient is necessary and sufficient for confining laser light generated in the active layer 105. With this coefficient, even a thin film can absorb light effectively, so that the current constriction layer 108 has the effect of confining light in a transverse direction in the active layer 105.

Thereafter, a $SiO_2$ mask pattern having a stripe-shaped opening with a width of about 1 µm is formed on the current constriction layer 108. The current constriction layer 108 is etched with 10 normal of potassium hydroxide (KOH) solution kept at about 30° C. to partially remove a portion of the current constriction layer 108 corresponding to the mask opening. Thus, the current constriction layer 108 having the stripe-shaped opening 120 is formed. At this time, the etching stop and re-evaporation preventing layer 106 is unlikely to be etched, so that it effectively functions as an etching stop layer.

Next, the $SiO_2$ mask is removed from the wafer with hydrofluoric acid (HF). The wafer is placed in a reactor furnace in an MOCVD apparatus, and heated to about 1050° C. While the wafer temperature is maintained at 1050° C., TMG (about $4\times10^{-4}$ mols per min.), TMA (about $5\times10^{-6}$ mols per min.), and $CP_2Mg$ (about $5\times10^{-6}$ mols per min.) are flowed, and allowed to grow for about 25 minutes. Thus, the second cladding layer 107 is formed to a thickness of about 0.2 $\mu$m. Thereafter, the supply of TMA is stopped, and TMG (about $4\times10^{-4}$ mols per min.) and $CP_2Mg$ (about $5\times10^{-6}$ mols per min.) are allowed to grow so as to form the contact layer 109 having a thickness of about 0.5 $\mu$m. At this time, a dislocation density is very high in the vicinity of an interface between the current constriction layer 108 grown at a low temperature and the second cladding layer 107 which is a re-growth layer, and a stress between the second cladding layer 107 and the underlying layer is relieved so as to decrease the strain.

Thereafter, the wafer is taken out of the reactor furnace in the MOCVD apparatus. The wafer is heat-treated in a nitrogen atmosphere at about 700° C. for about 20 minutes, whereby the second cladding layer 107 with magnesium added thereto and the contact layer 109 are rendered a p-type with a low resistivity. After this treatment, the second cladding layer 107 has a hole concentration of about $1\times10^{18}$ $cm^{-3}$, and the contact layer 109 has a hole concentration of about $5\times10^{18}$ $cm^{-3}$.

Next, the contact layer 103 is partially exposed by etching. The n-side electrode 110 made of Ti—Al is formed on the contact layer 103, and the p-side electrode 111 made of Ni—Al is formed on the contact layer 109.

The wafer is divided into chips by scribing or dicing, thereby producing the semiconductor laser device 100 as shown in FIG. 1. The semiconductor laser device 100 is completed by being packaged by an ordinary method.

A current is flowed through the semiconductor laser device, thus obtained, without coating a reflective mirror on a facet so as to control reflectivity. As typical characteristics, semiconductor laser oscillation is observed at a blue wavelength of about 432 nm at a threshold current of about 40 mA, and a rise current at this time is about 3 volts. Furthermore, a driving current at an output of about 5 mW is about 47 mA, an efficiency is about 0.3 W/A, and a driving voltage is about 3.6 volts. Furthermore, as typical angle of radiation characteristics, a stable single transverse mode with a divergent angle of about 12° and an ellipticity of about 2 is obtained, and continuous oscillation for about 100 hours or longer is observed.

As described above, in Embodiment 1, a nitride group compound semiconductor laser device can be obtained, which satisfies a low oscillation threshold current (about 40 mA), reliability of continuous oscillation (about 100 hours or longer), and stable transverse mode characteristics for the following reason: An absorption mechanism involved in an impurity level which is smaller by one or more orders of magnitude than an absorption coefficient (about $5\times10^5$ $cm^{-1}$) utilizing an inter-band level of an ordinary semiconductor is applied to the current constriction layer 108, whereby a low absorption coefficient (about $5\times10^3$ $cm^{-1}$) can be realized; as a result, a waveguide having light absorption sufficient for stabilizing a laser transverse mode can be realized, and a light absorption loss in a waveguide is reduced, whereby an abnormal increase in a threshold current can be suppressed. Furthermore, the current constriction layer 108 is rendered highly resistant by including impurities in a high concentration, so that it can conduct current constriction by effectively blocking a current.

Next, a growth temperature of the current constriction layer 108 in the semiconductor laser device 100 in Embodiment 1 will be described.

Herein, four semiconductor laser devices are produced in the same way as described above, except that the growth temperature of the current constriction layer 108 is changed from about 500° C. to about 300° C., about 400° C., about 600° C., and about 700° C.

Semiconductor laser devices obtained by setting the growth temperature of the current constriction layer 108 at about 600° C. or lower (about 300° C., about 400° C., and about 600° C.) exhibit a single transverse mode. However, a semiconductor laser device obtained by setting the growth temperature of the current constriction layer 108 at about 700° C. exhibits an unstable mode in which the shape of an oscillation mode changes when a current value is changed.

Furthermore, in the semiconductor laser device obtained by setting the growth temperature of the current constriction layer 108 at about 700° C., wet etching as described above is impossible.

The semiconductor laser device exhibits an oscillation threshold current value of about 120 mA when the current constriction layer 108 is grown at about 300° C., about 60 mA at a growth temperature of about 400° C., about 35 mA at a growth temperature of about 600° C., and about 17 mA at a growth temperature of about 700° C. Thus, the semiconductor laser device exhibits a tendency that as the growth temperature of the current constriction layer 108 becomes higher, the oscillation threshold current value becomes smaller. In the semiconductor laser device obtained when the current constriction layer 108 is grown at about 300° C., a threshold current exceeded about 100 mA, and an operating time of only one minute is maintained, which is not practical.

The concentration of carbon contained in the current constriction layer 108 is measured in these semiconductor laser devices. The carbon concentration is about $7\times10^{21}$ $cm^{-3}$, about $3\times10^{21}$ $cm^{-3}$, about $1\times10^{20}$ $cm^{-3}$, and about $6\times10^{18}$ $cm^{-3}$ at a growth temperature of about 300° C., about 400° C., about 600° C., and about 700° C. of the current constriction layer 108, respectively. Furthermore, the light absorption coefficient with respect to a laser wavelength in the current constriction layer 108 is about $1\times10^5$ $cm^{-1}$, about $3\times10^4$ $cm^{-1}$, about $1\times10^3$ $cm^{-1}$, and about $1\times10^2$ $cm^{-1}$ at a growth temperature of about 300° C., about 400° C., about 600° C., and about 700° C. of the current constriction layer 108, respectively.

Accordingly, the following is found in Embodiment 1. In order to realize appropriate light absorption in the current constriction layer 108 and stabilize a transverse mode of laser oscillation to prevent an unnecessary increase in a threshold current, it is preferable that the growth temperature of the current constriction layer 108 is set at about 400° C. to about 600° C. Furthermore, it is preferable that the concentration of carbon in the current constriction layer 108 is set at about $3\times10^{21}$ $cm^{-3}$ to about $1\times10^{20}$ $cm^{-3}$.

In Embodiment 1, the current constriction layer 108 may be formed of any composition of $Ga_xAl_yIn_{1-(x+y)}N$ ($0 \leq x \leq 1$, $0 \leq y \leq 1$, $0 \leq x+y \leq 1$). However, in the case where the Al composition is high, the current constriction layer 108 will have a low resistivity, and an anti-etching property and a light absorption coefficient thereof are likely to decrease. In the case where the In composition is high, the current constriction layer 108 will have a low resistivity, and an anti-etching property and a light absorption coefficient are likely to increase. Therefore, in Embodiment 1, considering these three elements, the current constriction layer 108 is formed by using GaN exhibiting the best characteristics.

Embodiment 2

Figure 2:
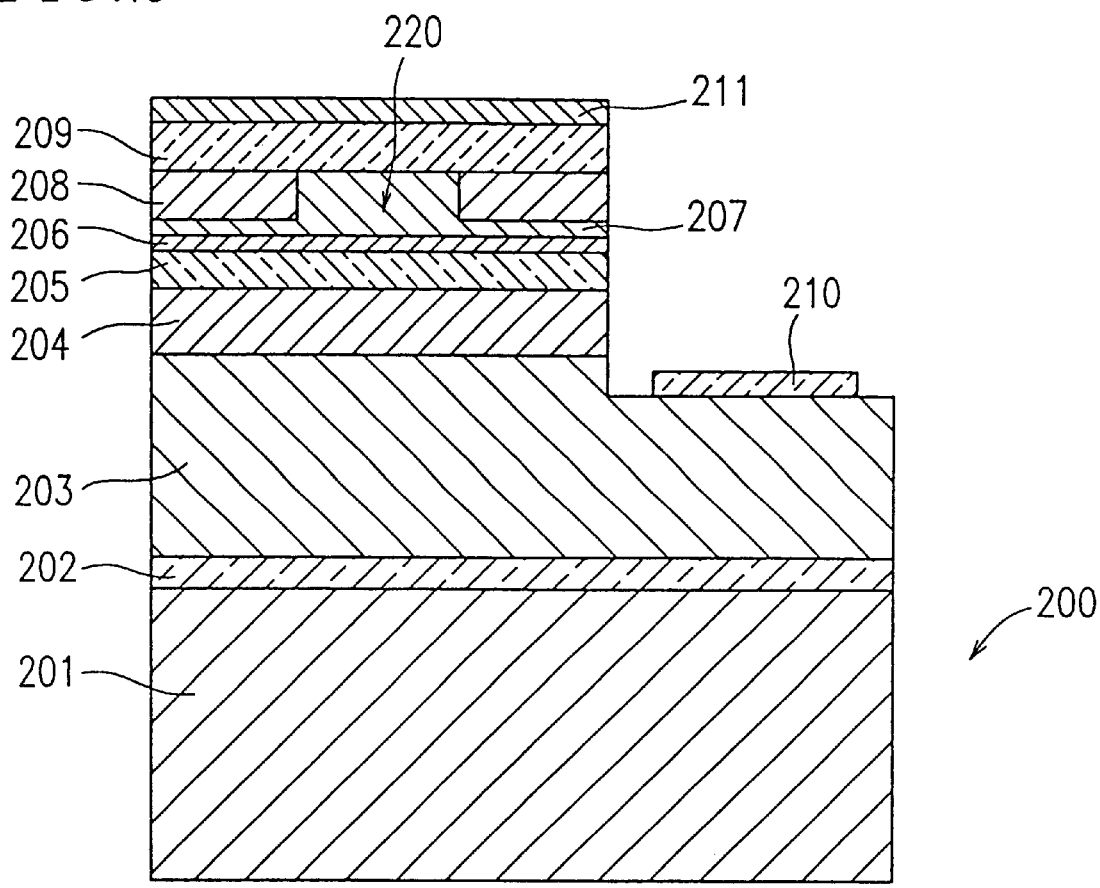
FIG. 2 is a cross-sectional view showing a structure of a nitride group compound semiconductor laser device in Embodiment 2 of the present invention.
Figure 3:
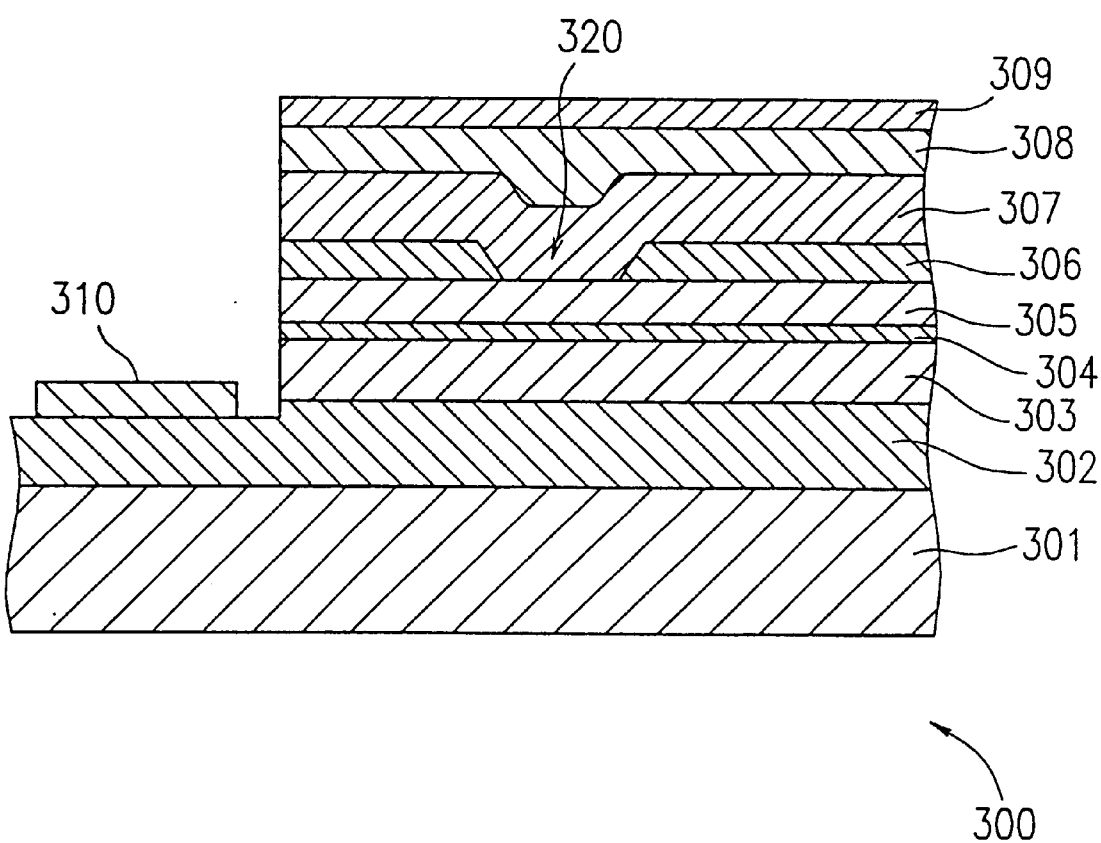
FIG. 3 is a cross-sectional view showing a structure of a conventional nitride group compound semiconductor laser device.

FIG. 2 is a cross-sectional view showing a structure of a nitride group compound semiconductor laser device 200 in Embodiment 2.

The semiconductor laser device 200 includes a GaN buffer layer 202, an n-type GaN contact layer 203, an n-type $Al_{0.15}Ga_{0.85}N$ first cladding layer 204, an $In_{0.25}Ga_{0.75}N$ active layer 205, and a p-type GaN re-evaporation preventing layer 206, and a p-type $Al_{0.15}Ga_{0.85}N$ second cladding layer 207 on a C-plane of a sapphire substrate 201. The second cladding layer 207 is irradiated with charged particles except for a stripe-shaped portion 220, whereby the irradiated portion becomes a current constriction layer 208 and the stripe-shaped portion 220 becomes a current passage. On the second cladding layer 207 and the current constriction layer 208, a contact layer 209 is formed. The first cladding layer 204, the active layer 205, the re-evaporation preventing layer 206, the second cladding layer 207, the current constriction layer 208 and the contact layer 209 are partially removed so as to expose the contact layer 203. A p-side electrode 211 is formed on the contact layer 209, and an n-side electrode 210 is formed on the exposed portion of the contact layer 203.

The semiconductor laser device 200 is produced as follows.

First, the buffer layer 202, the contact layer 203, the first cladding layer 204, the active layer 205, the re-evaporation preventing layer 206, and the second cladding layer 207 are grown on a C-plane of the sapphire substrate (wafer) 201 by the same production process as employed in Embodiment 1. Thereafter, the wafer is taken out of a reactor furnace in an MOCVD apparatus.

Next, the wafer is placed in a convergent ion beam apparatus, and Ga ions are implanted onto a portion of the wafer except for the stripe-shaped portion 220 with a width of about 1 μm in a dose amount of about $10 \times 15$ $cm^{-2}$. Herein, a pattern of a Ga ion implantation region is designed to be that of the current constriction layer 208, and an acceleration voltage of Ga ions is prescribed so that an implantation depth of Ga ions becomes about 0.4 μm. A region onto which Ga ions are radiated (i.e., the current constriction layer 208) has a resistivity of about $6 \times 10^3$ Ω·cm, and a composition of $Al_{1-w}Ga_wN$ ($0 \leq w \leq 1$). In a nitride group compound semiconductor, constituent atoms are bonded to each other so strongly that an etching amount by ion irradiation is extremely small. Furthermore, the nitride group compound semiconductor is uniformly etched in a C-axis direction, so that the surface of the semiconductor after irradiation with ions can be kept smooth. The difference in height between the ion-irradiated portion and the non-irradiated portion is measured to be about 3 nm by an apparatus for measuring a surface step difference. Furthermore, when etch pits formed of melted KOH are observed, a density thereof is about $1 \times 10^{13}$ $cm^{-2}$, which is higher by two or more orders of magnitude than that of an as-grown GaN single crystal film. Furthermore, a light absorption coefficient in the ion-irradiated region (i.e., current constriction layer 208) is about $5 \times 10^4$ $cm^{-1}$, which is sufficiently larger than the non-irradiated region.

Then, the wafer is placed in a reactor furnace in an MOCVD apparatus, and the wafer temperature is raised to about 1050° C. While maintaining this temperature, TMG (about $4 \times 10^{-4}$ mols per min.) and $CP_2Mg$ (about $5 \times 10^{-6}$ mols per min.) are flowed, and allowed to grow for about 10 minutes, whereby the contact layer 209 is grown to a thickness of about 0.5 μm on the surfaces of the cladding layer 207 and the current constriction layer 208.

Thereafter, the wafer is taken out of the reactor furnace in the MOCVD apparatus. The wafer is heat-treated in a nitrogen atmosphere at about 700° C. for about 20 minutes, whereby the second cladding layer 207 with magnesium added thereto and the contact layer 209 are rendered a p-type having a low resistivity. After this treatment, the second cladding layer 207 has a hole concentration of about $1 \times 10^{18}$ $cm^{-3}$, and the contact layer 209 has a hole concentration of about $5 \times 10^{18}$ $cm^{-3}$. On the other hand, a carrier strap is formed in a high concentration in the current constriction layer 208 by Ga ion irradiation, so that the current constriction layer 208 will not have a low resistivity even by a heat treatment.

Next, the contact layer 203 is partially exposed by etching. The n-side electrode 210 made of Ti/Al is formed on the contact layer 203, and the p-side electrode 211 made of Ni/Al is formed on the contact layer 209.

The wafer is divided into chips by scribing or dicing, thereby producing the semiconductor laser device 200 as shown in FIG. 2. The semiconductor laser device 200 is completed by being packaged by an ordinary method.

A current is flowed through the semiconductor laser device, thus obtained, without coating a reflective mirror on a facet so as to control reflectivity. As typical characteristics, semiconductor laser oscillation is observed at a blue wavelength of about 432 nm at a threshold current of about 50 mA, and a rise current at this time is about 3 volts. Furthermore, a driving current at an output of about 5 mW is about 47 mA, an efficiency is about 0.3 W/A, and a driving voltage is about 3.6 volts. Furthermore, as typical angle of radiation characteristics, a stable single transverse mode with a divergent angle of about 12° and an ellipticity of about 2 is obtained, and continuous oscillation for about 100 hours or longer is observed.

As described above, in Embodiment 2, a nitride group compound semiconductor laser device can be obtained, which satisfies a low oscillation threshold current (about 50 mA), reliability of continuous oscillation (about 100 hours or longer), and stable transverse mode characteristics for the following reason: A low absorption coefficient (about $5 \times 10^4$ $cm^{-1}$) which is smaller than an absorption coefficient (about $5 \times 10^5$ $cm^{31\ 1}$) utilizing an inter-band level of an ordinary semiconductor is realized in a blue region which is a laser oscillation wavelength; as a result, a waveguide having light absorption sufficient for stabilizing a laser transverse mode can be realized, and a light absorption loss in a waveguide is reduced, whereby an abnormal increase in a threshold current can be suppressed. Furthermore, the current constriction layer 208 is rendered highly resistant by including a carrier trap in a high concentration by irradiation of charged particles, so that it can conduct current constriction by effectively blocking a current.

In Embodiment 2, a convergent ion beam is used, which can be controlled with precision and draw a pattern without using a mask made of $SiO_2$ or the like. However, the current constriction layer 208 can be formed by ion implantation using a mask in the similar manner.

In Embodiment 2, the current constriction layer 208 is formed by irradiating charged particles onto a part of the second cladding layer 207. However, the irradiated portion is not limited thereto.

The present invention has been described by way of embodiments. The present invention is not limited to the combinations of the materials and the layer structures as shown in Embodiments 1 and 2. For example, the present invention is applicable to a nitride group compound semiconductor laser device including, as an active layer, a double-hetero structure composed of a combination of a GaN active layer/AlGaN cladding layer, etc. or a single quantum well (SQW) and a multi quantum well (MQW) composed of a nitride group compound semiconductor. Furthermore, in Embodiments 1 and 2, the cases where semiconductor layers are grown on a C-plane of a sapphire substrate have been described. However, the semiconductor layers may be formed on an A-plane, an M-plane, or an R-plane of the sapphire substrate. Furthermore, a known substrate made of SiC, GaAS, ZnO, or the like may be used. Furthermore, the present invention is applicable to any of a laser structure in which semiconductor lasers are grown on an n-type substrate, and a laser structure in which semiconductor layers are grown on a p-type substrate. Furthermore, as a method for growing films used in the production process of a semiconductor laser device, a molecular beam epitaxy (MBE) method, a liquid phase epitaxy (LPE) method, a metal-organic molecular beam epitaxy (MOMBE) method, an atomic layer epitaxy (ALE) method, or the like may be applicable in place of the MOCVD method mentioned above.

As described above, according to the present invention, a current constriction layer in a nitride group compound semiconductor laser device is composed of a high-resistant layer obtained by crystallizing an amorphous or polycrystalline nitride group compound semiconductor by heating or composed of a high-resistant layer obtained by irradiating charged particles to crystal of an nitride group compound semiconductor. Therefore, current constriction as well as light confinement can be effectively conducted. Such a current constriction layer is capable of obtaining an absorption coefficient which is smaller than an absorption coefficient (about $5\times10^5$ cm$^{-1}$) utilizing an inter-band absorption of an ordinary semiconductor. This can reduce a threshold current during laser oscillation, and decrease the amount of heat generated in each portion of the semiconductor laser device. Thus, a highly reliable nitride group compound semiconductor laser device can be realized, which is operated at a low driving current (which cannot be realized in the conventional example) and in which an oscillating transverse mode is stable.

Furthermore, according to the present invention, an amorphous or polycrystalline nitride group compound semiconductor can be grown with good controllability at a low temperature (less than about 700° C.), and the film thus obtained can be rendered highly resistant by including carbon (C) or silicon (Si) in a high concentration (e.g., about $1\times10^{20}$ cm$^{-3}$ or more). Thus, a current constriction layer which effectively blocks a current and has a necessary and sufficient absorption coefficient can be produced. Such an amorphous or polycrystalline nitride group compound semiconductor can be easily subjected to wet etching at a temperature of about 80° C. or lower which is suitable for photolithography. Therefore, the yield of a semiconductor laser device can be substantially enhanced. Furthermore, such an amorphous and polycrystalline nitride group compound semiconductor is formed into single crystal under the condition that it contains impurities in a high concentration during a temperature increasing process (re-growth after etching), so that outstanding device characteristics can be realized, with a crystal quality of the overlying semiconductor layers being satisfactory. Furthermore, since a nitride group compound semiconductor (Ga$_x$Al$_y$In$_{1-(x+y)}$N ($0\leq X\leq 1$, $0\leq y\leq 1$, $0\leq x+y\leq 1$)) which is difficult to use for a current constriction layer in the conventional example can be used according to the present invention, reliability can be substantially enhanced, preventing damage during an operation of a semiconductor laser device.

Furthermore, according to the present invention, a cladding layer which is disposed above an active layer is irradiated with charged particles except for a stripe-shaped portion, whereby the irradiated portion can be rendered highly resistant. Therefore, the stripe-shaped portion (non-irradiated portion) which is to be a current passage and the current constriction layer (irradiated portion) can be formed with good controllability. An absorption coefficient of the current constriction layer increases due to the defect level, so that the current constriction layer having a necessary and sufficient light absorption can be obtained. Furthermore, the current constriction layer is rendered highly resistant due to the irradiation of charged particles, so that surface damage thereof can be substantially decreased. Since a nitride group compound semiconductor (Ga$_x$Al$_y$In$_{1-(x+y)}$N ($0\leq x\leq 1$, $0\leq y\leq 1$, $0\leq x+y\leq 1$)) which is difficult to use for a current constriction layer in the conventional example can be used according to the present invention, reliability can be substantially enhanced, preventing damage during an operation of a semiconductor laser device.

Various other modifications will be apparent to and can be readily made by those skilled in the art without departing from the scope and spirit of this invention.

Accordingly, it is not intended that the scope of the claims appended hereto be limited to the description as set forth herein, but rather that the claims be broadly construed.

What is claimed is:

1. A nitride group compound semiconductor laser device, comprising:
   a pair of cladding layers;
   an active layer interposed between the cladding layers; and
   a current constriction layer having a stripe-shaped opening which is to be a current passage, provided above the active layer,
   wherein the current constriction layer has a light absorption coefficient of less than $1\times10^5$ cm$^{-1}$ with respect to a laser wavelength in a wavelength region of blue to ultraviolet, so as to provide a light confinement in the lateral direction of waveguide passage by means of light absorption, further wherein the current constriction layer is made of Ga$_x$Al$_y$In$_{1-(x+y)}$N ($0\leq x\leq 1$, $0\leq y\leq 1$, $0\leq x+y\leq 1$) containing impurities in an amount of $1\times10^{20}$ cm$^{-3}$ or more.

2. A nitride group compound semiconductor laser device of claim 1, wherein the current constriction layer is made of GaAlInN including impurities in an amount of $1\times10^{20}$ cm$^{-3}$ or more.

3. A nitride group compound semiconductor laser device according to claim 1, wherein a re-evaporation preventing layer and/or an etching stop layer is provided between the active layer and the current constriction layer.

4. A nitride group compound semiconductor laser device according to claim 1, wherein a contact layer is provided above both the current constriction layer and the stripe-shaped opening or the stripe-shaped portion.

5. A nitride group compound semiconductor laser device according to claim 1, wherein the light absorption coefficient in the current constriction layer with respect to laser wavelength is equal to or more than $5 \times 10^3$ cm$^{-1}$.

6. A nitride group compound semiconductor laser device according to claim 1, wherein the current constriction layer is formed of a high resistant layer.

7. A nitride group compound semiconductor laser device according to claim 1, wherein the current constriction layer is a layer of an amorphous or crystalline or multicrystalline nitride compound semiconductor.

8. A nitride group compound semiconductor laser device according to claim 1, wherein:

the impurities included in the current constriction layer include at least carbon.

9. A nitride group compound semiconductor laser device, comprising:

a pair of cladding layers;

an active layer interposed between the cladding layers; and a current constriction layer excluding a stripe-shaped portion which is to be a current passage, provided above the active layer, wherein the current constriction layer is formed of a high resistant layer obtained by irradiating charged particles to crystal of a nitride group compound semiconductor, further wherein the current constriction layer is made of Ga$_x$Al$_y$In$_{1-(x+y)}$N ($0 \leq x \leq 1$, $0 \leq y \leq 1$, $0 \leq x+y \leq 1$) containing impurities in an amount of $1 \times 10^{20}$ cm$^{-3}$ or more.

10. A nitride group compound semiconductor laser device according to claim 9, wherein a re-evaporation preventing layer is provided between the active layer and the current constriction layer.

11. A nitride group compound semiconductor laser device according to claim 9, wherein a contact layer is provided above both the current constriction layer and the stripe-shaped opening or the stripe-shaped portion.

12. A nitride group compound semiconductor laser device of claim 9, wherein the current constriction layer is a region disposing from a surface of a p-type AlGaN cladding layer to a depth of 0.4 µm thereof.

13. A nitride group compound semiconductor laser device including Indium, comprising:

a pair of cladding layers;

an active layer interposed between the cladding layers; and a current constriction layer having a stripe-shaped opening which is to be a current passage, provided above the active layer, wherein the current constriction layer is a high resistant layer of an amorphous or polycrystalline nitride group compound semiconductor formed into a single crystal under a temperature increasing process, further wherein the current constriction layer is made of Ga$_x$Al$_y$In$_{1-(x+y)}$N ($0 \leq x \leq 1$, $0 \leq y \leq 1$, $0 \leq x+y \leq 1$) containing impurities in an amount of $1 \times 10^{20}$ cm$^{-3}$ or more, and said current constriction layer includes Indium and a high concentration of impurities.

14. A nitride group compound semiconductor laser device, comprising:

a pair of cladding layers;

an active layer interposed between the cladding layers; and a current constriction layer having a stripe-shaped opening which is to be a current passage, provided above the active layer, wherein the current constriction layer has a light absorption coefficient of less than $1 \times 10^5$ cm$^{-1}$ with respect to a laser wavelength, so as to provide a light confinement in the lateral direction of waveguide passage by means of light absorption in a region except for the stripe-shaped opening, further wherein the current constriction layer is made of Ga$_x$Al$_y$In$_{1-(x+y)}$N ($0 \leq x \leq 1$, $0 \leq y \leq 1$, $0 \leq x+y \leq 1$) containing impurities in an amount of $1 \times 10^{20}$ cm$^{-3}$ or more.

* * * * *